United States Patent [19]
Gruchalla et al.

[11] Patent Number: 5,157,361
[45] Date of Patent: Oct. 20, 1992

[54] NONLINEAR TRANSMISSION LINE

[76] Inventors: Michael E. Gruchalla, 4815 Palo Duro Ave. NE., Albuquerque, N. Mex. 87110; David C. Koller, 4622 Idlewilde La. SE., Albuquerque, N. Mex. 87108

[21] Appl. No.: 698,604

[22] Filed: May 10, 1991

[51] Int. Cl.$^5$ .................. H01P 3/06; H01P 3/08
[52] U.S. Cl. .................... 333/20; 333/164; 333/238; 333/243; 357/14
[58] Field of Search ............. 333/20, 164, 238, 243, 333/245–247; 357/14

[56] References Cited

U.S. PATENT DOCUMENTS

| | | | |
|---|---|---|---|
| 3,778,643 | 12/1973 | Jaffe | 307/293 |
| 4,229,717 | 10/1980 | Krone et al. | 333/156 |
| 4,460,880 | 7/1984 | Turner | 333/247 X |
| 4,568,889 | 2/1986 | Bagraktaroglu | 333/247 X |
| 4,630,011 | 12/1986 | Neidert et al. | 333/161 X |
| 4,855,696 | 8/1989 | Tan et al. | 333/20 |
| 5,014,018 | 5/1991 | Rodwell et al. | 333/20 |

OTHER PUBLICATIONS

Landauer, Rolf, "Parametric Amplification Along Nonlinear Transmission Lines", Journal of Applied Physics, vol. 31, No. 3, Mar., 1960, pp. 479–484.
Khokhlov, R. V., "The Theory of Radio Shock Waves in Nonlinear Transmission Lines", Radio Engineering and Electronic Physics, vol. 6, No. 6, Jun., 1961, pp. 817–824.
Auston, David H., "Probing Semiconductors With Femtosecond Pulses", Physics Today, Feb., 1990, pp. 46–54.

Primary Examiner—Paul Gensler

[57] ABSTRACT

The present invention comprises a novel semiconductor device which further comprises a nonlinear transmission-line structure. The semiconductor device is that of a very long narrow voltage-dependent capacitor, such as a semiconductor diode or MOS capacitor, where the anode and cathode electrodes comprise the conductors of a transmission line and the depletion region comprises the dielectric of the transmission line. An input signal is applied at one end of the long, narrow structure. Such signal application results in the launch of a traveling wave traveling along the transmission-line structure. At the far end of the transmission-line structure, the signal is coupled out and applied to a load. The temporal and spatial modulation of the depletion capacitance of the semiconductor device as the traveling wave travels along the transmission-line structure results in temporal compression of the input signal. Input signals of comparatively slow transition time therefore have their transition time reduced such that the transition time of the output signal is much faster than that of the input signal. Output signals exhibiting picosecond transition times may be obtained from input signals exhibiting nanosecond transition times. Further, since the nonlinear transmission line according to the present invention may incorporate many of the properties of conventional semiconductor devices, but in a novel configuration, comparatively high-voltage nonlinear transmission lines according the present invention may be fabricated to provide correspondingly high-voltage, or high-current, output signals.

20 Claims, 5 Drawing Sheets

NONLINEAR TRANSMISSION LINE

I. FIELD OF THE INVENTION

The present invention relates to a nonlinear transmission-line device. More specifically, the invention relates to a device for the generation of high-level electrical signals exhibiting very rapid transitions in voltage and current.

II. BACKGROUND OF THE INVENTION

In many electronic applications, electrical signals exhibiting a very rapid transition in voltage or current are required. For example, an electrical signal in the form of a step function with a very rapid step transition is a common input signal applied to a device or system under test to allow the transfer function of the device under test to be determined from the corresponding output signal. Such testing of very high-frequency devices requires step-function signals of correspondingly fast transition time.

Another example of the use of an electrical signal exhibiting very rapid transition in voltage or current is in the art of electronic sampling. In an electronic sampling system, a very narrow electrical impulse signal is applied to a sampling gate to capture a very short time interval of some signal being measured. In order to effectively sample signals of relatively high frequency characteristics, a sampling pulse of comparatively short time duration is required. Also, a sampling pulse of relatively high amplitude is often required to effectively drive the sampling gate.

Generation of signals exhibiting relatively rapid transition times is common in the prior art. Common devices applied for generation of such signals are step-recovery diodes, tunnel diodes, avalanche transistors, gas switches such as thyratrons, spark gaps, and Josephson-junction devices among others. Although the transition times of such prior-art devices are relatively rapid, such transition times are too slow, with the exception of the Josephson-junction devices, in comparison to the high-frequency capability of typical devices in the art that could be evaluated or their signals sampled by means of a more rapid transition signal. For example, a linear rf amplifier exhibiting a maximum upper frequency capability of 25 GHz would require an input test signal exhibiting a transition time of about 10 ps or less to effectively evaluate the amplifier transfer function. Further, a sampling pulse exhibiting a pulse width on the order of 5 ps or less would be required to effectively sample the 25 GHz signal at the upper frequency capability of such an amplifier. Josephson-junction devices exhibit suitable transition times, but lack sufficient output signal level for effective use in such applications. The fastest transition times available from other prior-art devices are on the order of 20 ps or slower. Further, the specific devices capable of providing the fastest transition times are also limited to comparatively small signal amplitudes. Therefore, common devices of the prior art cannot provide both the rapid signal transition and high signal amplitude required.

The nonlinear transmission line according to the present invention provides for signals of both rapid transition and high signal amplitude by means of a novel continuous nonlinear transmission-line structure. The theory of operation of nonlinear transmission lines is well known in the art and described in, for instance, a paper entitled "The Theory of Radio Shock Waves in Nonlinear transmission Lines," by R. Khokhlov, *Radio Engineering and Electronic Physics,* Volume 6, Number 6, Jun., 1960, page 817. The use of nonlinear transmission lines for generation of signals exhibiting fast transition times is also well known in the prior art and is described in, for instance, a paper entitled "Parametric Amplification along Nonlinear Transmission Lines" by R. Landauer, *Journal of Applied Physics,* Volume 31, Number 3, Mar., 1960, page 479. Landauer teaches a generally conventional microstrip transmission line incorporating a ferroelectric crystal dielectric Under very specific conditions, such a dielectric exhibits nonlinear properties which in turn results in a nonlinear transmission line when such a material is applied as the dielectric of a transmission-line structure.

The nonlinear transmission line according to the present invention is significantly different from the nonlinear transmission line taught by Landauer. The present invention comprises a semiconductor device of novel construction and operation further comprising a continuous transmission line which exhibits a highly non-linear characteristic. For example, the nonlinear transmission line according to the present invention may be configured comprising a single novel semiconductor diode or a single novel semiconductor capacitor comprising an insulating layer deposited on a semiconductor substrate, for example a metal-oxide semiconductor (MOS) capacitor. Therefore, the nonlinear transmission line according to the present invention comprising a novel semiconductor device is significantly different from the nonlinear transmission line incorporating a ferroelectric crystal dielectric as taught by Landauer.

The nonlinear transmission line taught by Landauer suffers from the limitation that it must be operated very near the polarization transition temperature of the ferroelectric crystal dielectric. Maintaining such accurate temperature control complicates a nonlinear transmission-line system as taught by Landauer and increases the cost to manufacture and operate such a system. The nonlinear transmission line according to the present invention overcomes that limitation in a nonlinear transmission line by the use of a semiconductor device to provide a variable capacitance characteristic in a nonlinear transmission line. Although semiconductor characteristics are somewhat temperature dependent, such temperature dependence is much less severe than that of a typical ferroelectric crystal requiring operation at a very specific temperature such as the polarization transition temperature. Therefore, the nonlinear transmission line according to the present invention may be operated over a very wide temperature range without temperature control. For example, a nonlinear transmission line according to the present invention could be operated over a temperature range of −40° C. to +125° C. without the need for any type of temperature control. Further, since the properties of the semiconductor device comprising the nonlinear transmission line according to the present invention may be controlled accurately in manufacture, a nonlinear transmission line according to the present invention may be manufactured for optimum operation at a specific temperature. The elimination of the need for complex, costly temperature control and the capability of operation over a very wide temperature range in a nonlinear transmission line are significant improvements over the prior art provided by the nonlinear transmission line according to the present invention.

Another limitation in the nonlinear transmission line taught by Landauer is that the ferroelectric crystal must be selected to provide suitable nonlinear properties at a usable temperature. That severely limits the available selection of dielectric materials suitable for a nonlinear transmission line according to Landauer. Such restrictions result in detrimental compromise of such transmission line properties as rf loss and maximum operating frequency. The nonlinear transmission line according to the present invention overcomes those limitations in a nonlinear transmission line by allowing utilization of high-performance rf semiconductor materials, for example, Gallium-Arsenide (GaAs) and Silicon (Si), common in the art of microwave rf components. In a nonlinear transmission line according to the present invention, the various critical properties of the nonlinear transmission-line structure, for example, loss, maximum operating frequency, propagation velocity, characteristic impedance, nonlinear characteristics, and others may be optimized for specific applications. The capability to preserve desired performance and optimize critical parameters in a nonlinear transmission line are significant improvements over the prior art provided by the nonlinear transmission line according to the present invention.

An integrated semiconductor device comprising a linear transmission-line system is described in U.S. Pat. No. 3,778,643 entitled "A SOLID STATE VARIABLE DELAY LINE USING REVERSED-BIASED PN JUNCTIONS," to Jaffe. Jaffe teaches a substantially standard microstrip transmission-line structure as is common in the art. Such a microstrip transmission-line structure comprises a semiconductor slab to which an extended grounded conductive plane is deposited on one surface of such semiconductor slab and a strip conductor is deposited on the other surface thus forming a common microstrip transmission-line construction. The linear transmission-line system taught by Jaffe further comprises, as specifically required elements in such a linear transmission-line system, a semiconductor material further comprising homogeneous semiconductor diode structure, a biasing means to apply required direct-current bias, and a signal source limited to specific comparatively low-frequency operation to assure slow-wave mode operation. Whereas the linear transmission line system taught by Jaffe is specifically designed for operation as a linear transmission line as recited by Jaffe in column 2, line 50 of U.S. Pat. No. 3,778,643, and specifically for operation in a slow-wave mode, its constructions and materials are not consistent with operation as a nonlinear transmission line or at extremely high frequencies well above the slow-wave mode frequencies. More specifically, to assure linear operation in a transmission-line system taught by Jaffe, the transmission-line system is constructed of materials and structures to assure that there is substantially no variation in the transmission-line capacitance as a function of the applied signal propagating in the transmission line. In the transmission-line system taught by Jaffe, the capacitance of the linear transmission line is a function only of a direct-current bias.

The nonlinear transmission line according to the present invention is significantly different in both form and function from the linear transmission-line system taught by Jaffe. The purpose of the present invention is to provide in a transmission line highly nonlinear operation with arbitrary input signals and operation at extremely high frequencies. Specifically, in the transmission line according to the present invention, the capacitance of the nonlinear transmission-line structure at any point along the non-linear transmission-line structure is highly a function of the actual signal voltage at that point in the nonlinear transmission line. Such capacitance variation as a function of the propagating signal is significantly different from the linear transmission-line system taught by Jaffe in which the transmission-line capacitance is independent of the propagating signal. Also, the present invention comprises a semiconductor device of novel construction and operation further comprising a continuous nonlinear transmission line which provides different transmission-line characteristics at different positions along the length of such transmission line and additionally provides highly nonlinear operation. Such novel construction of the nonlinear transmission line according to the present invention provides operation with arbitrary input signals without the need for any external biasing means and further provides output signals of extremely high frequency characteristics. Therefore, the nonlinear transmission line according to the present invention including no external biasing means and further comprising a novel semiconductor device providing operating with arbitrary external input signals is significantly different and novel from the prior art taught by Jaffe.

A limitation in the linear transmission-line system taught by Jaffe in comparatively high-frequency operation is that the properties of the homogeneous diode structure comprising the transmission-line capacitance are constant along the line length thus providing a homogeneous transmission line. Therefore, in the linear transmission line taught by Jaffe, the properties of the transmission line are everywhere substantially the same along the line as would be required for linear operation. Accordingly, the linear transmission line taught by Jaffe cannot be optimized for optimum operation with comparatively high frequency signals or for propagation experiencing a maximum nonlinear effect. The nonlinear transmission line according to the present invention overcomes that limitation in the linear transmission-line system taught by Jaffe in the propagation of signals of comparatively high frequency by a novel variable structure providing different transmission-line characteristics at different positions along the length of the nonlinear transmission line. Such structure allows for optimization of performance and critical parameters in the nonlinear transmission line according to the present invention. The capability to optimize desired performance and to optimize critical parameters along the line length in a nonlinear transmission line are significant improvements over the prior art provided by the nonlinear transmission line according to the present invention.

Another limitation in the linear transmission line system taught by Jaffe is that it incorporates as a specifically included element of the linear transmission line system a continuous-wave signal source of comparatively low frequency. The requirement of such a specific and limited source as an integral element of the linear transmission line system taught by Jaffe severely limits the use of such system. The nonlinear transmission line according to the present invention overcomes that limitation in the linear transmission-line system taught by Jaffe by elimination of such an integral signal source and by providing means of coupling any arbitrary external signal to the input of the nonlinear transmission line according to the present invention. Therefore, the nonlinear transmission line according to the present invention may be applied with any arbitrary input signal. For example, a single pulse or any manner of continuous signal may be input to the nonlinear transmission line according to the present invention. Further, the nonlinear transmission line according to the present invention may be used as an integral element in an otherwise conventional signal transmission system. For example, a nonlinear transmission line according to the present invention may be applied with a first coaxial transmission line connected to its input terminal and a second coaxial transmission line connected to its output terminal. In such application the nonlinear transmission line according to the present invention would provide correction for the signal degrading effects of the two coaxial transmission lines connected input and output. The capability of operation with external and arbitrary input signals in a nonlinear transmission line are significant improvements over the prior art provided by the nonlinear transmission line according to the present invention.

Another limitation in the linear transmission-line system taught by Jaffe is that a biasing means is specifically required for proper operation. At very high frequencies, such biasing means would introduce objectionable perturbations in the output signal due to parasitic elements of such biasing means. Such perturbations could be minimized by careful design and implementation of the biasing means, but the system complexity would be objectionably increased. The nonlinear transmission line according to the present invention eliminates that limitation in the linear transmission-line system taught by Jaffe by novel configuration and operation which eliminates the requirement for a separate biasing means. The elimination of a separate biasing means in a nonlinear transmission line is a significant improvement over the prior art provided by the nonlinear transmission line according to the present invention.

Still another limitation in the linear transmission-line system taught by Jaffe is that such system is specifically required to be of a grounded microstrip line construction as referenced hereinabove. Such a line configuration severely limits the optimization and application of such a linear transmission-line system as taught by Jaffe. The nonlinear transmission line according to the present invention overcomes that limitation in a nonlinear transmission line by providing for various different basic transmission-line configurations to provide optimum performance needed in applications that will become apparent by application of the invention. For example, the nonlinear transmission line according to the present invention may be configured as coplanar transmission line to provide improved performance at extremely high frequencies and simplified construction by planar processes, or the transmission line according to the present invention may be configured as a simple parallel-plate transmission line for use in balanced-signal applications. The capability to provide different basic transmission-line structures in a nonlinear transmission line is a significant improvement over the prior art provided by the nonlinear transmission line according to the present invention.

Another integrated semiconductor device comprising a linear transmission-line structure is described in U.S. Pat. No. 4,229,717 entitled "VOLTAGE CONTROLLED SLOW WAVE TRANSMISSION LINE," to Krone, et. al. Krone teaches a substantially standard microstrip transmission-line structure as is common in the art. Such a linear transmission line as taught by Krone comprises a semiconductor slab on which a layer of insulating dielectric material is deposited on one surface and with a narrow strip conductor further deposited on the insulating dielectric layer. The insulating dielectric material as taught by Krone exhibits substantially no nonlinear effect. A grounded conductive plane is deposited on the other surface of the semiconductor slab. The strip conductor is substantially of a more narrow geometry than the ground plane such that the structure taught by Krone is substantially a microstrip transmission-line structure. The characteristics of the linear transmission line taught by Krone are controlled by application of an external control voltage. Further, the materials and specific construction of the linear transmission line taught by Krone limits operation to comparatively low frequencies in the slow-wave mode. Specifically, as previously described hereinabove with reference to the linear transmission line taught by Jaffe, the linear transmission line taught by Krone, in order to provide linear operation as taught by Krone, exhibits substantially no variation int eh transmission-line capacitance as a function of the propagating signal. The transmission-line capacitance is a function of only a direct-current bias in a similar manner as taught by Jaffe. Such a line will operate as a conventional linear transmission line as taught by Krone and will not provide signal compression common in a nonlinear transmission line.

The nonlinear transmission line according to the present invention is significantly different from the linear transmission line taught by Krone in both form and function. Specifically, the primary purpose in the nonlinear transmission line according to the present invention is to provide in a transmission line very nonlinear characteristics and operation at extremely high frequencies. Whereas the linear transmission line taught by Krone provides linear transmission-line performance and specifically in the slow-wave mode, the nonlinear, high-frequency performance of the nonlinear transmission line according to the present invention comprising a novel semiconductor device construction is significantly different and novel from the prior art taught by Krone.

A limitation in the linear transmission line taught by Krone in nonlinear operation is that the strip conductor is of constant width and the semiconductor structure of constant properties all along the length of the linear transmission-line structure thus providing a homogeneous transmission line. Such a homogeneous transmission-line is required for linear operation. As previously referenced hereinabove with reference to the linear transmission line taught by Jaffe, such a homogeneous transmission-line structure cannot provide optimization in high-frequency, nonlinear operation. The nonlinear transmission line according to the present invention overcomes that limitation in the linear transmission-line system taught by Krone in the propagation of signals of comparatively high frequency by a novel variable structure providing different transmission-line characteristics at different positions along the length of the transmission line of the nonlinear transmission line according to the present invention. Such structure allows for optimization of performance and critical parameters in the nonlinear transmission line according to the present invention. The capability to optimize desired performance and to optimize critical parameters along the line length in a nonlinear transmission line are significant improvements over the prior art provided by the nonlinear transmission line according to the present invention.

Another limitation in the linear transmission line taught by Krone in extremely high-frequency operation is the requirement for application of a separate control voltage. As previously referenced hereinabove, the application of such a separate control voltage will introduce objectionable signal degradation in high-frequency operation and will objectionably increase complexity. The nonlinear transmission line according to the present invention requires no separate control voltage. The elimination of a separate control voltage in a nonlinear transmission line is still another significant and novel improvement over the prior art provided by the nonlinear transmission line according to the present invention.

Still another limitation in the linear transmission line taught by Krone in extremely high-frequency operation is that materials and constructions are specifically selected to provide operation in a slow-wave mode. The nonlinear transmission line according to the present invention comprises specific materials such as extremely high-frequency Gallium-Arsenide materials and specific constructions such as high-frequency coplanar transmission-line structures to provide nonlinear performance at extremely high frequencies. The use of materials and constructions providing very high-frequency performance in a nonlinear transmission line is yet another significant and novel improvement over the prior art provided by the nonlinear transmission line according to the present invention.

The use of semiconductor diodes to provide a nonlinear capacitance in a lumped-element transmission-line structure is also known in the prior art and is described in, for instance, a paper "Hyperabrupt-Doped GaAs Nonlinear Transmission Line For Picosecond Shockwave Generation" by C. J. Madden, et. al., *Applied Physics Letters*, Volume 54, Number 11, Mar., 1989, page 1019. The nonlinear transmission line taught by Madden comprises several discrete semiconductor diodes interconnected by suitable electrodes to form a lumped-element transmission-line structure. Since the several individual semiconductor diodes exhibit variable capacitance characteristics, the lumped-element transmission line taught by Madden exhibits nonlinear transmission-line characteristics. Each individual discrete semiconductor diode in the nonlinear transmission line taught by Madden is substantially a simple lumped-element diode structure as is common in the art of semiconductor diodes. Therefore, each individual diode structure alone as taught by Madden exhibits neither transmission-line characteristics nor any manner of nonlinear transmission-line characteristics.

The nonlinear transmission line according to the present invention is significantly different from the nonlinear transmission line taught by Madden. The nonlinear transmission line according to the present invention comprises a single semiconductor device of a novel construction and operation further comprising a continuous nonlinear transmission-line structure. Whereas the nonlinear transmission line according to the present invention is a continuous transmission-line structure, it is significantly different from the prior art taught by Madden comprising a lumped-element transmission-line structure further comprising several individual semiconductor diodes where each such individual semiconductor diode is of a generally standard construction as is common in the prior art of semiconductor diodes.

A limitation in the lumped-element nonlinear transmission line taught by Madden is that it exhibits a characteristic cutoff frequency as is common in the art of lumped-element transmission lines. That cutoff frequency is determined by the capacitance value of each of the several semiconductor diodes and the value of the inductance of the interconnecting electrodes as is well known in the art of lumped-element transmission lines. In order to achieve high cutoff frequencies, the values of that capacitance and inductance must be made as small as possible. Correspondingly, in order to provide small values of capacitance and inductance, small feature size in the semiconductor structures and metallizations are required. Since such small feature sizes are limited by the physical limitations of the manufacturing process, the lumped-element nonlinear transmission line taught by Madden is then limited in maximum operating frequency by the physical limitations in the manufacturing process. The nonlinear transmission line according to the present invention overcomes that limitation in the lumped-element nonlinear transmission line taught by Madden by the use of a continuous transmission-line structure. Whereas the nonlinear transmission line according to the present invention is continuous in nature, it does not exhibit the objectionable limiting characteristic cutoff frequency common in the lumped-element nonlinear transmission lines of the prior art. The elimination of a characteristic cutoff frequency in a nonlinear transmission line is a significant improvement over the prior art provided by the nonlinear transmission line according to the present invention.

Another limitation in the lumped-element nonlinear transmission line taught by Madden is that only a small portion of the total electrical line length is active in producing the desired nonlinear effect. That results in excessive electrical loss. To explain in more detail, the length of electrode utilized to interconnect between adjacent individual diodes in the lumpedelement nonlinear transmission line taught by Madden is much longer electrically than the actual diode electrical dimension on the line. The interconnecting electrode length in the lumpedelement transmission line cannot be reduced in length since such length is selected to provide the specific inductance required for Therefore, the total line loss in the lumped-element nonlinear transmission line as taught by Madden is the sum of the losses contributed by the actual individual diode structures and the interconnecting electrodes. Whereas the total interconnecting electrode electrical length is very much longer than the total combined electrical length of the several individual diodes in the line taught by Madden, the total loss in the line taught by Madden is dominated by the interconnecting electrodes. Whereas such electrodes do not contribute to the desired nonlinear effect in such a line, any loss as a consequence of such electrodes is an undesirable excess loss. The nonlinear transmission line according to the present invention overcomes that limitation in the line taught by Madden by a novel continuous nonlinear transmission line which eliminates the need for such inter-diode interconnecting electrodes which do not contribute to the desired nonlinear effect. Whereas the nonlinear transmission line according to the present invention comprises only a single transmission-line element, the need for objectionable inter-diode interconnecting electrodes is totally eliminated. The elimination of the inter-diode interconnecting electrodes in a nonlinear transmission line is a significant improvement over the prior art provided by the nonlinear transmission line according to the present invention.

Another limitation in the lumped-element nonlinear transmission line as taught by Madden is that the extremely small feature sizes necessary to provide the small values of capacitance and inductance required to maximize the line cutoff frequency significantly reduces the maximum voltage capabilities of such a line. The dielectric strength of the various materials limits the maximum voltage that may be applied. As the feature size of the various devices and the device spacing are reduced, the maximum operating voltage is reduced accordingly. That limitation severely limits the maximum operating voltage. Therefore, the maximum amplitude of the output signal that may be delivered by the lumped-element nonlinear transmission line taught by Madden is substantially limited. The nonlinear transmission line according to the present invention overcomes that limitation of the prior art nonlinear transmission lines by a novel continuous nonlinear transmission-line structure comprising a single semiconductor device. Whereas the continuous nonlinear transmission line according to the present invention exhibits no characteristic cutoff frequency, device feature sizes are not directly a function of maximum desired operating frequency. Feature sizes may be selected to optimize other operating parameters, such as maximum output voltage for example. Whereas a nonlinear transmission line according to the present invention may be effected as a single semiconductor diode of novel configuration, operating voltages available in such a semiconductor diode embodiment of the nonlinear transmission line according to the present invention are substantially similar to operating voltages available in conventional semiconductor diodes common in the prior art. Operating voltages as high as 1000V or higher and correspondingly high output signals, either voltage or current, may be provided in a nonlinear transmission line according to the present invention. The capability of operation at high operating voltages and the capability of delivering output signals of high voltage or current in a nonlinear transmission line are significant improvements over the prior art provided by the nonlinear transmission line according to the present invention.

Still another limitation in the lumped-element nonlinear transmission line taught by Madden is that the very small feature sizes and the multiple elements required in such a lumped-element nonlinear transmission line serve to reduce the yield of acceptable devices available in manufacture. Such a reduction in yield increases the manufacturing cost of such devices. The nonlinear transmission line according to the present invention overcomes that limitation by reduction of device complexity and by permitting application of feature sizes consistent with high manufacturing yield. Since the nonlinear transmission line according to the present invention comprises only a single semiconductor element, its complexity is significantly less than that of the prior art taught by Madden. The reduction in complexity and the ability to select feature size to improve manufacturing yield without compromise in performance in a nonlinear transmission line are significant improvements over the prior art provided by the nonlinear transmission line according to the present invention.

A semiconductor-diode embodiment of the nonlinear transmission line according to the present invention is significantly different from semiconductor diodes common in the prior art in both structure and operation. Semiconductor diodes of the prior art typically comprise an anode and a cathode electrode where the length and width of an electrode are approximately similar. A signal is applied in a semiconductor diode of the prior art homogeneously at each electrode such that the instantaneous voltage at any position on an electrode is substantially equal to the voltage at any other position on that electrode at the same instant in time.

A semiconductor-diode embodiment of the nonlinear transmission line according to the present invention comprises a semiconductor-diode junction that is very long with-respect-to its width. Similarly, each diode electrode is very long and narrow. That structure is significantly different from typical semiconductor diodes of the prior art. Further, an input signal is applied to a semiconductor-diode embodiment of the present invention at one end of the diode structure between the two diode electrodes. That novel signal application configuration results in a traveling wave being launched between the two long, narrow diode electrodes such that the electrodes act as the conductors of a transmission line. Therefore, the instantaneous voltage at one position on an electrode of the nonlinear transmission line according to the present invention is not necessarily equal to the voltage at some other position on that electrode at the same instant in time.

Further, whereas a semiconductor diode structure comprising a nonlinear transmission line according to the present invention is comparatively long, the properties of such semiconductor diode may be made different at different positions along such a long semiconductor diode structure. The selection of such different properties at different positions along the length of the nonlinear transmission line according to the present invention allows optimization for specific operation, for example minimum loss or maximum nonlinear effect.

The configuration of a semiconductor diode comprising a long, narrow junction of different properties along the length of such semiconductor diode and the launching of a traveling-wave signal along the diode electrodes in a nonlinear transmission-line mode as provided in the nonlinear transmission line according to the present invention are novel in the art of semiconductor diodes.

An embodiment of the nonlinear transmission line according to the present invention comprising an insulating layer on a semiconductor substrate, an MOS capacitor for example, is significantly different from semiconductor capacitors common in the prior art in both structure and operation for the same reasons as identified hereinabove for a semiconductor-diode embodiment of the present invention.

The nonlinear transmission line according to the present invention comprising an improved nonlinear transmission line provides higher operating frequency and higher operating voltage over that available in nonlinear transmission lines of the prior art. Additionally, the nonlinear transmission line according to the present invention provides in a nonlinear transmission line operation over a very wide temperature range which is a very significant improvement over the prior art. Also, the wider latitude in selection of device geometry provided in the nonlinear transmission line according to the present invention providing for optimization of various operating parameters is another significant improvement over the prior art. Further, the reduced complexity provided in the nonlinear transmission line according to the present invention improves production yield and in turn reduces cost in a nonlinear transmission line over that provided by the prior art.

SUMMARY OF THE INVENTION

Accordingly, it is an object of the present invention to provide a nonlinear transmission line which produces output signals exhibiting very rapid transition times.

Another object of the present invention is to provide in a nonlinear transmission line different transmission-line characteristics at different positions along the length of a nonlinear transmission line.

Another object of the present invention is to provide in a nonlinear transmission line the capability to use various basic transmission-line configurations.

Another object of the present invention is to provide in a nonlinear transmission line very high operating voltages.

Another object of the present invention is to provide in a nonlinear transmission line very high output voltages.

Another object of the present invention is to provide in a nonlinear transmission line very high operating frequencies.

Another object of the present invention is to provide in a nonlinear transmission line operation over a very wide temperature range.

Still another object of the present invention is to provide in a nonlinear transmission line reduced complexity.

Further objects of the present invention are to provide improved production yield and lower production cost in a nonlinear transmission line.

Additional objects and advantages of the present invention will be set forth in part from the description that follows and, in part, will be obvious from the description or learned by practice of the invention. The objects and advantages of the present invention may be realized and obtained by the methods and apparatus particularly pointed out in the appended claims.

The present invention achieves the objects set forth above by means of a novel semiconductor device of novel construction and operation.

Specifically, to achieve the objects and in accordance with the purposes of the invention, as broadly described herein, the present invention provides a semiconductor device comprising: long, narrow electrodes substantially forming a transmission line; a semiconductor structure such as a semiconductor diode or semiconductor capacitor provided between and along the length of the long, narrow electrodes and where the capacitance of such semiconductor diode or semiconductor capacitor is a highly variable function of the signal in the nonlinear transmission line according to the present invention; signal application means at one end of the long, narrow electrodes; and means of signal extraction at the opposite end of the long, narrow electrodes; and wherein the semiconductor characteristics and the electrode geometry along the length of the semiconductor device are made different at different positions along the semiconductor device to optimize performance of the nonlinear transmission line according to the present invention.

The accompanying drawings, which are incorporated in and constitute a part of the specification, illustrate a presently preferred embodiment of the present invention and, together with the description, serve to explain the principles of the invention.

DESCRIPTION OF THE PREFERRED EMBODIMENT

Figure 1:
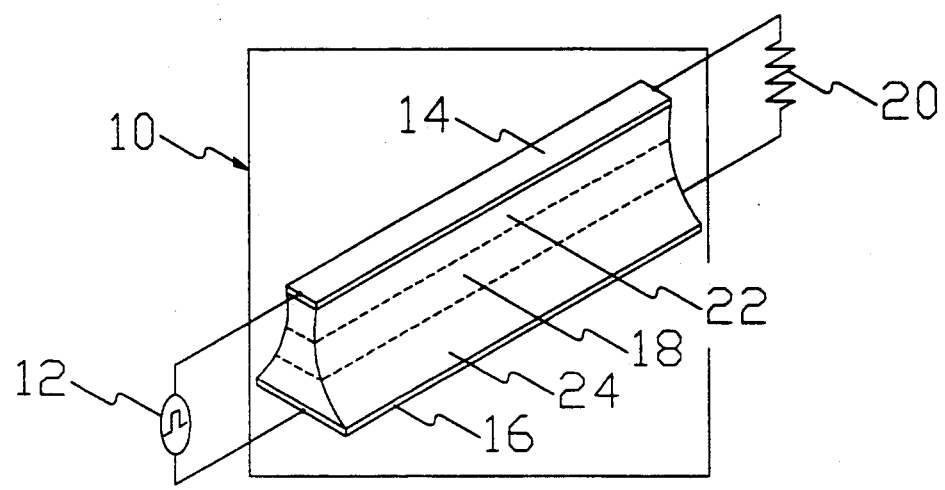
FIG. 1 is an isometric drawing of a parallel-plate transmission-line semiconductor-diode embodiment of the nonlinear transmission line according to the present invention.

Reference will now be made in detail to a presently preferred semiconductor-diode embodiment of the present invention, an example of which is illustrated in FIG. 1 of the included drawings. The purpose of the nonlinear transmission line 10 according to the present invention is to accept an arbitrary input signal 12 applied between electrodes 14 and 26 and to communicate the signal along the parallel-plate transmission line comprising current-carrying conductors formed by electrodes 14 and 16 and dielectric formed substantially by the depletion region 18, and to finally deliver the signal to a load 20 connected between electrodes 14 and 16. Regions 22 and 24 are doped to comprise a semiconductor diode such that one electrode, either 14 or 16, is the anode, the other electrode, either 16 or 14 is the cathode, and region 18 is the depletion region as is common in the art of semiconductor diodes. Whereas the width of the depletion region 18 between electrodes 14 and 16 at any position along transmission line structure 10 is a function of the voltage applied across the depletion region at such position, normally of a polarity to reverse-bias the diode junction, as is well known in the art of semiconductor diodes, the capacitance per unit length of transmission line formed by electrodes 14 and 16 and depletion region 18 is a function of the signal voltage applied across the electrodes 14 and 16.

The physical structure and artistic renderings of the of the present invention shown in the included drawings are intended as illustrative and not in a limiting sense. Accordingly, a nonlinear transmission line according to the present invention is not limited to a semiconductor-diode structure and may comprise any manner of semiconductor device which exhibits a variable capacitance characteristic. For example, whereas the capacitance of certain semiconductor capacitors, such as a metal-oxide semiconductor (MOS) capacitor structure as is common in the art of semiconductor devices, is varied by the voltage applied across such a capacitor, a nonlinear transmission line according to the present invention may comprise any manner of such semiconductor capacitor means as the signal-dependent variable capacitance element of the nonlinear transmission-line structure. Embodiments of the present invention comprising a semiconductor capacitor such as an MOS structure would provide advantages in manufacture. For example, the effect of minor defects in the semiconductor substrate would be minimized.

The nonlinear transmission line of the present invention may comprise any semiconductor material means in its construction. For example, common Silicon (Si) semiconductor materials may be utilized in constructions the present invention to provide low cost constructions, and Gallium-Arsenide (GaAs) semiconductor materials, as are common in very high-frequency microwave components, may be utilized for maximum high-frequency performance. Other semiconductor material means may also be applied in constructions of the present invention to provide performance needed in applications that will become apparent by practice of the invention.

Further, for convenience of the drawings and the explanation which follows hereinbelow, the depletion region 18 with reference to FIG. 1 is shown throughout herein of a constant width between electrodes 14 and 16 for a constant voltage applied between electrodes 14 and 16 along the length of the nonlinear transmission line 10. However, in actual practice of the nonlinear transmission line according to the present invention the depletion width provided at zero signal, or at some other level selected to provide performance needed in applications that will become apparent by practice of the invention, may be made of different widths at different positions along the length of the nonlinear transmission line according to the present invention to provide performance needed in applications that will become apparent by practice of the invention.

Similarly, the geometry of the transmission-line electrodes, 14 and 16 in FIG. 1 for example, are shown throughout herein as constant-width conductors of constant relative spacing. In actual practice of the nonlinear transmission line according to the present invention, the transmission-line electrodes may made of different widths, or different spacings, or of both different widths and spacings, at different positions along the length of the transmission-line structure according to the present invention to provide performance needed in applications that will become apparent by practice of the invention. For example, such geometries would be used to maximize the nonlinear effect, minimize losses, or provide linear input and output line segments in a nonlinear transmission line according to the present invention.

Figure 2:
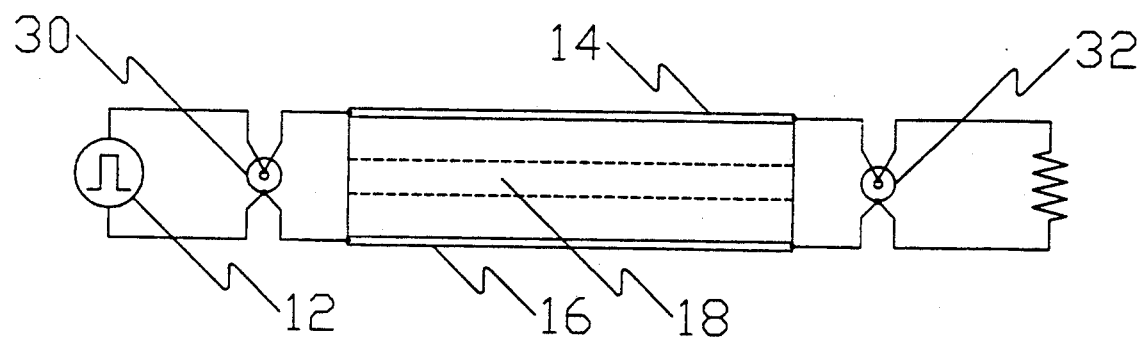
FIG. 2 is a side-view drawing of a nonlinear transmission line according to the present invention showing a narrow depletion region.

Also for convenience of the description, the embodiments of the present invention shown in the included drawings show the nonlinear transmission line according to the present invention, 10 with reference to FIG. 1, connected to a signal source 12 and a load 20. Whereas the novel performance in the present invention is provided totally by the novel structure of the nonlinear transmission line according to the present invention, any manner of input signal and output load may be applied with the present invention. With reference to FIG. 2 of the included drawings, an input connection means 30 and output connection means 32 would normally be included to allow connection of any manner of input signal and output load. For example, input may be communicated to the nonlinear transmission line according to the present invention by means of a coaxial transmission line such as a coaxial cable connected to input terminal 30. Similarly, output signal may be communicated from the nonlinear transmission line according to the present invention by means of a coaxial transmission line connected to output terminal 32.

Input means 30 and output means 32 are shown at the respective ends of a transmission line, but input means 30 and output means 32 may be connected between electrodes 14 and 16 at any point along the length of electrodes 14 and 16 to provide performance needed in applications that will become apparent by practice of the invention. For example, both input means 30 and output means 32 could be connected to the nonlinear transmission line according to the present invention at the same position near one end of such transmission line with the other end of such line remaining unterminated. Such a configuration would provide a reflection from the open line end such that the round-trip electrical length of the line would be longer than the physical length. Such configuration would reduce size and cost in a nonlinear transmission line according to the present invention, but at the expense of input-signal feed through and reduced output-signal amplitude. Also, multiple input means and multiple output means may be incorporated in the present invention to provide performance needed in applications that will become apparent by practice of the invention.

The propagation velocity $V_p$ of a transmission line as is well known in the art of transmission lines is given as $V_p = 1/\sqrt{(LC)}$ where L is the inductance per unit length and C the capacitance per unit length of the transmission line. Whereas the propagation velocity of a transmission line is a function of the capacitance per unit length of the transmission line, the propagation velocity at any position along the nonlinear transmission line according to the present invention as described herein is a function of the signal voltage applied to the line at such position. Also as is well known in the art of transmission lines, the characteristic impedance $Z_0$ of a transmission line is given as $Z_0 = \sqrt{(L/C)}$. Whereas the characteristic impedance of a transmission line is a function of the capacitance per unit length of the transmission line, the characteristic impedance of the nonlinear transmission line according to the present invention at any position along the transmission-line structure may be very accurately controlled for a given applied voltage at such position by the control of the dielectric geometry and the electrode geometry at such position.

With reference to FIG. 1, when an input signal 12 of a polarity serving to reduce the capacitance of the nonlinear transmission line according to the present invention and additionally exhibiting a transition time that is short with-respect-to the time that is required for a signal to propagate along the entire length of the nonlinear transmission-line structure 10 is applied between electrodes 14 and 16, the signal will travel along the transmission-line structure of the nonlinear transmission line according to the present invention in the form of a traveling wave. As such a traveling wave travels along the nonlinear transmission-line structure, that part of the transmission-line structure ahead of the traveling wave will have a different potential between the electrodes 14 and 16 than that portion of the transmission-line structure that the traveling wave has passed.

Figure 3:
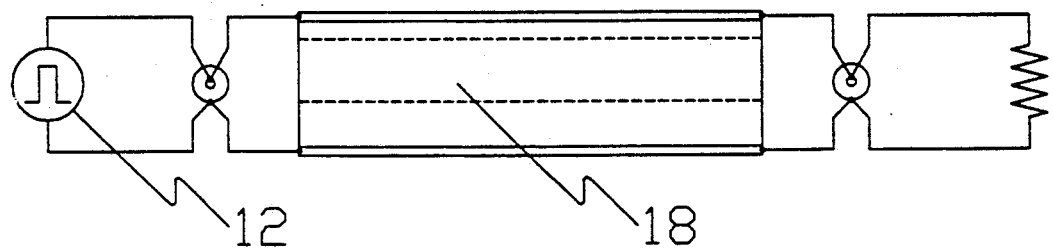
FIG. 3 is a side-view drawing of a nonlinear transmission line according to the present invention showing a wide depletion region.

To explain in more detail, FIG. 2 of the included drawings shows a side view of a nonlinear transmission line according to the present invention where the direction of propagation of a traveling-wave signal is from input terminal 30 to output terminal 32. It should be noted, however, that either end could be used as the input and the opposite end as the output. For the purpose of this explanation, with reference to FIG. 2, signal is input at terminal 30 and output at terminal 32. Also, as referenced hereinabove, the depletion region 18 is shown only of constant geometry in order to simplify the explanation and drawings, but depletion region 18 may be of different geometries at different positions along the length of the transmission-line structure. With zero voltage or some small constant voltage applied by input source 12 between electrodes 14 and 16, the depletion region 18 is narrow as shown in FIG. 2. Now with reference to FIG. 3, when a constant input voltage 12 is applied, the depletion region 18 is caused to become wider.

When the depletion region 18 in FIG. 2 is comparatively narrow, the capacitance per unit length of the nonlinear transmission line according to the present invention as described hereinabove is comparatively high. That high capacitance per unit length with a narrow depletion region results in a comparatively slow propagation velocity in the nonlinear transmission line according to the present invention. Further, with reference to FIG. 3, when the depletion region 18 is wide due to applied voltage, the capacitance per unit length is comparatively small and the line propagation velocity comparatively fast. Such capacitance variation in the nonlinear transmission line according to the present invention is provided by the actual applied input signal. Such variable capacitance characteristics wherein the line capacitance is highly a function of the actual applied signal is novel and significantly different from linear transmission lines of the prior art. Linear transmission lines of the prior art require a highly constant capacitance characteristic that is effectively constant and independent of the applied signal. Such a constant capacitance characteristic is necessary in order to provide distortion-free propagation of the signal as is the purpose of linear transmission lines of the prior art. Whereas it is the purpose of the nonlinear transmission line of the present invention t highly distort the input signal into a signal exhibiting a very rapid transition in voltage or current, the nonlinear transmission line of the present invention comprises a capacitance characteristic that is very strongly a function of the applied signal. Such a signal-dependent variable capacitance characteristic is a novel feature of the present invention over linear transmission lines of the prior art. In actual practice, it is practical to achieve capacitance variations of as much as 9 to 1. Such a capacitance variation results in a variation in propagation velocity of 3 to 1.

Figure 4:
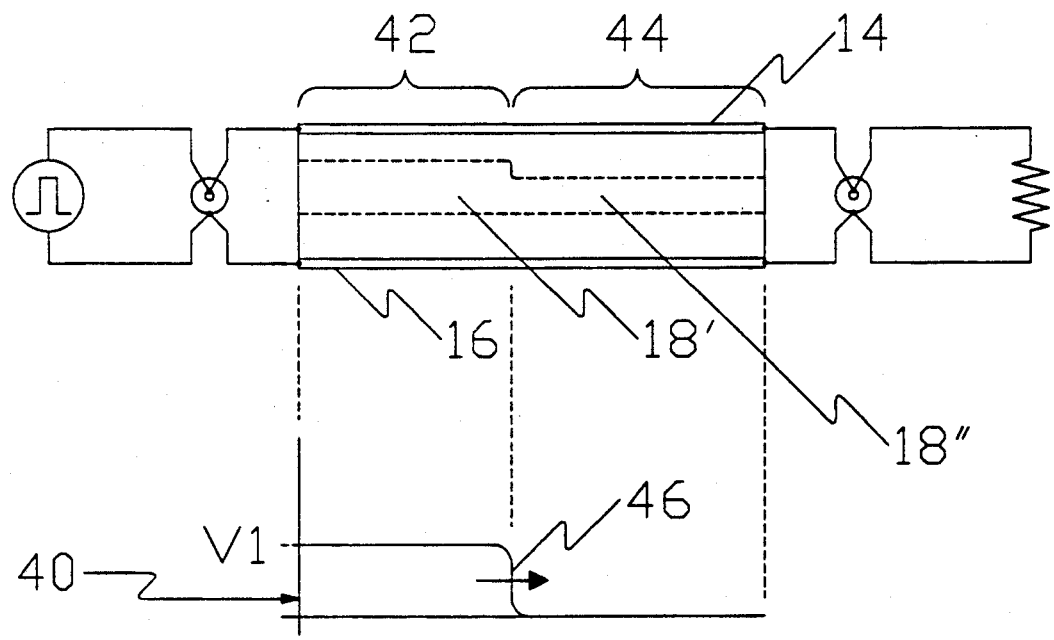
FIG. 4 is a side-view drawing of a nonlinear transmission line according to the present invention showing the spatial variation of the depletion region caused by a traveling wave in the nonlinear transmission line according to the present invention.

If a time-varying input signal, a step signal for example, is input to the nonlinear transmission line according to the present invention, a traveling wave will be launched into the nonlinear transmission line according to the present invention. FIG. 4 shows the nonlinear transmission line according to the present invention with a step traveling-wave signal that has traveled about half the length of the transmission-line structure. The amplitude of the voltage on the line as a function of position along the line is shown graphically in graph 40. In the line region 42, a voltage V1 is impressed across the line electrodes 14 and 16. The depletion region 18' in the line region 42 is wide due to the impressed line voltage. In the line region 44, there is no voltage impressed on the line between the line electrodes 14 and 16 since the traveling wave has not yet traveled into that region and the depletion region 18" is correspondingly narrow. Therefore, in the line region 42 the line propagation velocity will be faster, due to the lower capacitance per unit length, than the propagation velocity in line region 44. Also, the wave front 46 in the transmission-line structure traveling in the direction indicated in graph 40 travels at the slower velocity since the section of line in front of the wave front, line region 44, has no voltage applied and it therefore exhibits the slower propagation velocity.

Figure 5:
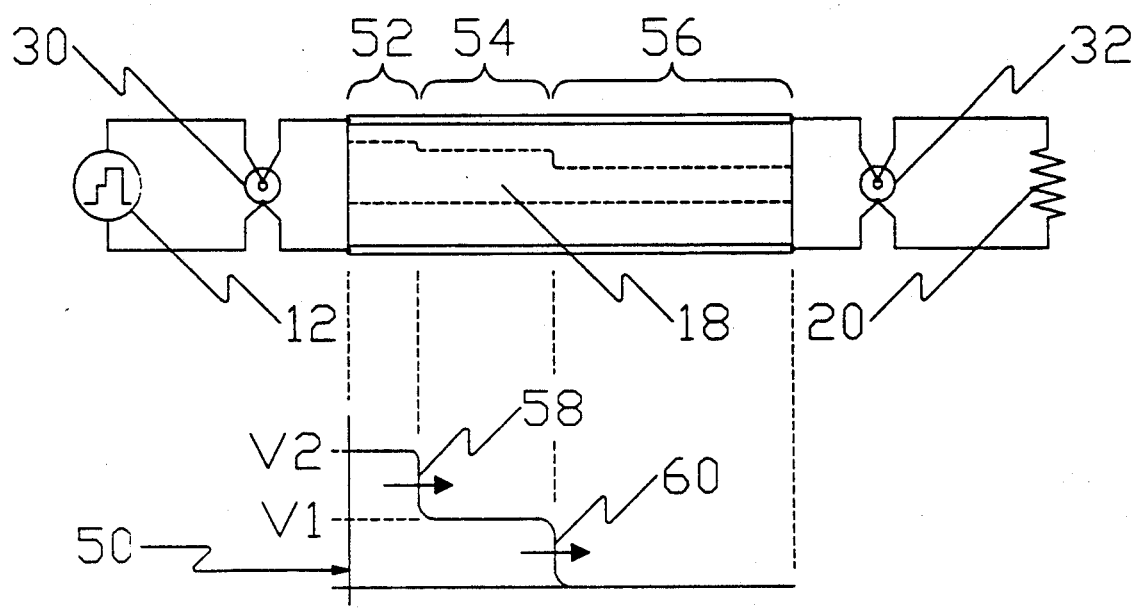
FIG. 5 is a side-view drawing of a nonlinear transmission line according to the present invention showing the spatial variation of the depletion region with a double step signal propagating in the nonlinear transmission line according to the present invention.

The temporal compression produced by the nonlinear transmission line according to the present invention is most easily described graphically. With reference to FIG. 5, consider a double-step input signal 12 has been input at terminal 30 of the nonlinear transmission line according to the present invention is shown graphically by 50. A step signal of amplitude V1 is first applied, and at some later time the signal voltage is raised in a step manner to the higher voltage amplitude V2. Graph 50 shows the spatial voltage distribution in the nonlinear transmission line according to the present invention with a double-step input signal propagating in the transmission-line structure. The typical profile of the depletion width under such conditions is shown by depletion width 18. Therefore, in the line regions 52 and 54 the propagation velocity will be comparatively fast and in region 56, comparatively slow. Therefore, the wave front 58 then travels faster than wave front 60. If the line structure is of sufficient length, the wave front 58 will overtake wave front 60 and the two wave fronts 58 and 60 will then continue to travel along the line as a single wave front exhibiting a very fast transition time. The signal then finally delivered to output terminal 32 and load 20 connected thereto will be a single step of a voltage amplitude V2 and of a very fast transition time.

As a further explanation, consider a nonlinear transmission line according to the present invention exhibiting, for zero applied voltage, a propagation time of 3ns required for a single step input signal to travel the length of the device. Additional y, consider that the change in propagation velocity available with some applied voltage is 3 to 1 as referenced hereinabove. If a first step signal, of sufficient amplitude to fully reduce the capacitance, is applied input and allowed to propagate for 2ns and then a second step signal applied superimposed upon the first as previously described hereinabove, both step signals will arrive ar the output of the nonlinear transmission line according to the present invention simultaneously even though they were launched 2ns apart. The first step signal requires 3ns to travel the length of the nonlinear transmission-line structure since it must travel along a line of maximum capacitance since the applied voltage is zero. The second step signal, since it 1s traveling in the section of line having an applied voltage equal to the voltage of the first step signal, travels at a faster velocity than the first step signal due to the lower line capacitance per unit length provided by the applied line voltage. The second step signal requires only 1ns to travel the length of the nonlinear transmission-line structure Therefore, at the rime that the second step is launched, 2ns after the first, the first step signal will require 1ns additional time to arrive at the output, and the second step signal will require only 1ns to travel the entire length of the nonlinear transmission-line structure. Thus, both step signals arrive at the output simultaneously. The 2ns time delay between the two step signals would be compressed to a very small time. It is noted that the absolute propagation velocity is not a factor in the time compression. Only the relative change in propagation velocity and the total propagation time is significant.

If the input signal in the example immediately above herein were a single step signal but with a transition time of 2ns, it can be seen that the 2ns transition time would be steepened as the signal traveled along the nonlinear transmission line according to the present invention since such a signal may be represented as a superposition of a number of arbitrarily small step signals. In such a representation of a signal traveling in a nonlinear transmission line according to the present invention, each small step signal wave front will travel slightly faster than the step signal just below it in amplitude until it overtakes that step immediately below it. Therefore, as the multi-step signal travels along the structure of the nonlinear transmission line according to the present invention, all of the individual small step wave fronts converge in a single traveling wave front. Thus, all the individual small step signals are delivered to the load at the output simultaneously such that the original 2ns transition time is decreased to a much shorter transition time at the line output.

As a traveling wave travels along the length of the nonlinear transmission line according to the present invention, the transmission-line properties required at any specific position along the nonlinear transmission line according to the present invention for any desired optimum propagation of the traveling wave, for example minimum signal reflections, minimum-loss propagation, or maximum signal steepening effect, are different at different positions along the transmission-line structure according to the present invention. Accordingly, with reference to FIG. 1, the depletion region 18 may be of different geometries at different positions along the length of the nonlinear transmission line according to the present invention to provide means of optimizing specific parameters of signal propagation For example, the width of the depletion region 18 could be made narrow at the input end of the nonlinear transmission line 10 connected to signal source 12 and tapered linearly, or of other desired profile providing performance needed in applications that will become apparent by practice of the invention, such that the depletion region 18 would be wider at the output of the nonlinear transmission line 10 connected to load 20. Similarly, the width of the transmission-line electrodes 14 and 16 may be of different widths, or different spacings, or of both different widths and spacings, at different positions along the length of the nonlinear transmission line 10 to provide performance needed in applications that will become apparent by practice of the invention.

Only those signals having a voltage transition polarity line according to the present invention to-be reduced, for example signals causing the diode structure of nonlinear transmission line 10 with reference to FIG. 1 to become more reverse biased, will be compressed as described hereinabove. Signals having a voltage transition polarity causing the capacitance to increase will be lengthened. For example, if a continuous square wave signal were input to the nonlinear transmission line according to the present invention, the signal transitions in one direction, for example transitions from less positive to more positive voltage, would be steepened while the transitions in the other direction, more positive to less positive voltage for this example, would be lengthened. At the output of the nonlinear transmission line according the present invention, the input square wave signal would be modified into a sawtooth signal exhibiting a slow transition from the higher voltage level to the lower voltage level and a very rapid voltage transition from the lower voltage level to the higher voltage level In a nonlinear transmission line according to the present invention, either polarity of signal transition may be steepened by choice of the polarity of the structure comprising the capacitance of the nonlinear transmission line according to the present invention. For example, with reference to a semiconductor-diode embodiment of the present invention as shown FIG. 1, if the nonlinear transmission-line structure 10 were configured with electrode 14 as the anode and electrode 16 as the cathode, signal transitions from more positive to less positive would be steepened Conversely, if electrode 14 were the cathode and electrode 16 the anode, signal transitions from less positive tomore positive would be steepened.

If the nonlinear transmission line according to the present invention is made longer than that necessary for all signal components to converge at the traveling wave front, no additional steepening of the wave front will occur since all components of the wave front will travel at the unbiased line propagation velocity. However, the longer the nonlinear transmission-line structure. The greater the available time compression. With longer structures, signals of slower transition time may be input while still achieving maximum time compression. However, as the structure length is increased, losses will also be increased. Therefore, the length of a nonlinear transmission-line structure according to the present invention would optimally be made of just sufficient length to achieve the desired time compression in a specified input signal, but may be made longer or shorter to provide performance needed in applications that will become apparent by practice of the invention.

The embodiment of the nonlinear transmission line according to the present invention shown in FIG. 1 comprises a generally conventional parallel-plate transmission-line structure. Alternately, other transmission-line structures may be used in a nonlinear transmission line according to the present invention. For example, a microstrip transmission-line structure could be provided by extending the width or one electrode, for example 16 with reference to FIG. 1, to either side such that such electrode is substantially wider than the other electrode 14. As referenced hereinabove, electrode 14 and depletion region 18 may also be of different widths at different positions along the length of such a microstrip transmission-line structure to provide performance needed in applications that will become apparent by practice of the invention. Transmission lines comprising more than two electrodes may also be provided in the nonlinear transmission line according to the present invention.

Figure 6:
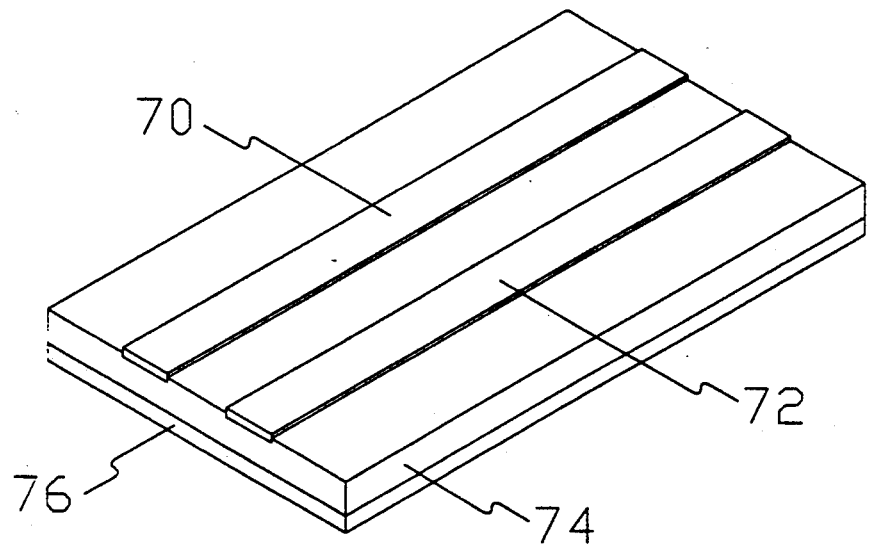
FIG. 6 is an isometric drawing of a coplanar parallel strip transmission-line structure.

Further, with reference to FIG. 6 of the included drawings, a transmission-line configuration comprising coplanar strip electrodes 70 and 72 could be utilized in a nonlinear transmission line according to the present invention where two strip electrodes 70 and 72 are placed side-by-side on a semiconductor substrate 74 and with a nonlinear transmission-line structure according to the present invention configured comprising the two strip electrodes. Operation of such an embodiment of the present invention comprising parallel coplanar strip electrodes is identical to that described hereinabove with reference to the embodiment of FIG. 1 and need not be repeated. In an embodiment of a nonlinear transmission line according to the present invention comprising such parallel coplanar strip electrodes, a conductive-plane 76 may be included or deleted to provide performance needed in applications that will become apparent by practice of the invention. Additionally, two conductive planes, one above and one below the strip electrodes 70 and 72 may be included, and where the materials between the coplanar strip electrodes and the two such conductive planes may be of the same material or of different materials. For example, a semiconductor material may be included between such strip electrodes and one such conductive plane, and air or other separation means may be included between such strip electrodes and such other conductive plane. In a coplanar strip embodiment of the present invention further comprising an insulating means, an MOS structure for example, either one or more coplanar strip electrodes may be placed on such insulating means.

Figure 7:
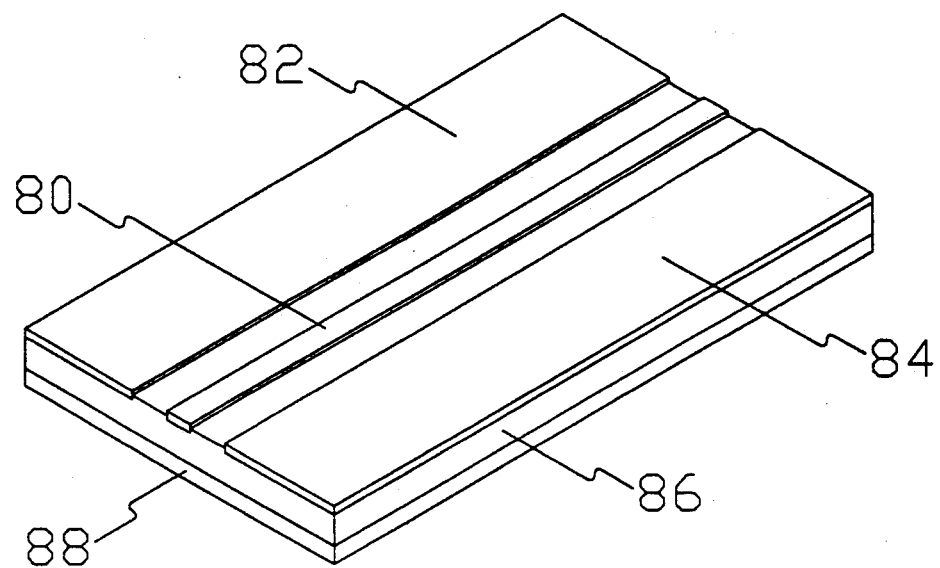
FIG. 7 is an isometric drawing of a coplanar transmission-line structure.

Additionally, with reference to FIG. 7 of the included drawings, a coplanar transmission-line structure could be utilized. The coplanar transmission line shown in FIG. 7 comprises a center conductor 80 and coplanar conductive planes 82 and 84 on either side of the center conductor 80 all configured on a semiconductor substrate 86. A nonlinear transmission-line structure according to the present invention may be provided comprising the center conductor 80 and each conductive plane 82 and 84, or comprising the center conductor 80 and only one conductive plane 82 or 84. Operation of such an embodiment of the present invention comprising such a coplanar transmission line is identical to that described hereinabove with reference to the embodiment of FIG. 1 and need not be repeated. The spacing between conductive plane 82 and center conductor 80 may be either equal to or different from the spacing of conductive plane 84 and center conductor 80 In an embodiment of a nonlinear transmission line according to the present invention comprising such a coplanar transmission line, a conductive plane 88 may be included or deleted to provide performance needed in applications that will become apparent by practice of the invention. If such conductive plane 88 is included, it may be electrically connected to both coplanar conductive planes 82 and 84, to either coplanar conductive plane 82 or 84, or may be electrically separate from both coplanar conductive planes 82 and 84. An application of an embodiment of a nonlinear transmission line according to the present invention comprising a coplanar transmission line further comprising a conductive plane 88 would be to utilize conductive plane 88 as a ground plane to control the transmission-line signal propagation modes. Additionally, two conductive planes, one below the coplanar transmission line as 88 and one above could be included and where the materials between the coplanar transmission-line structure and the two conductive planes may be of the same material or of different materials as previously described hereinabove.

Figure 8:
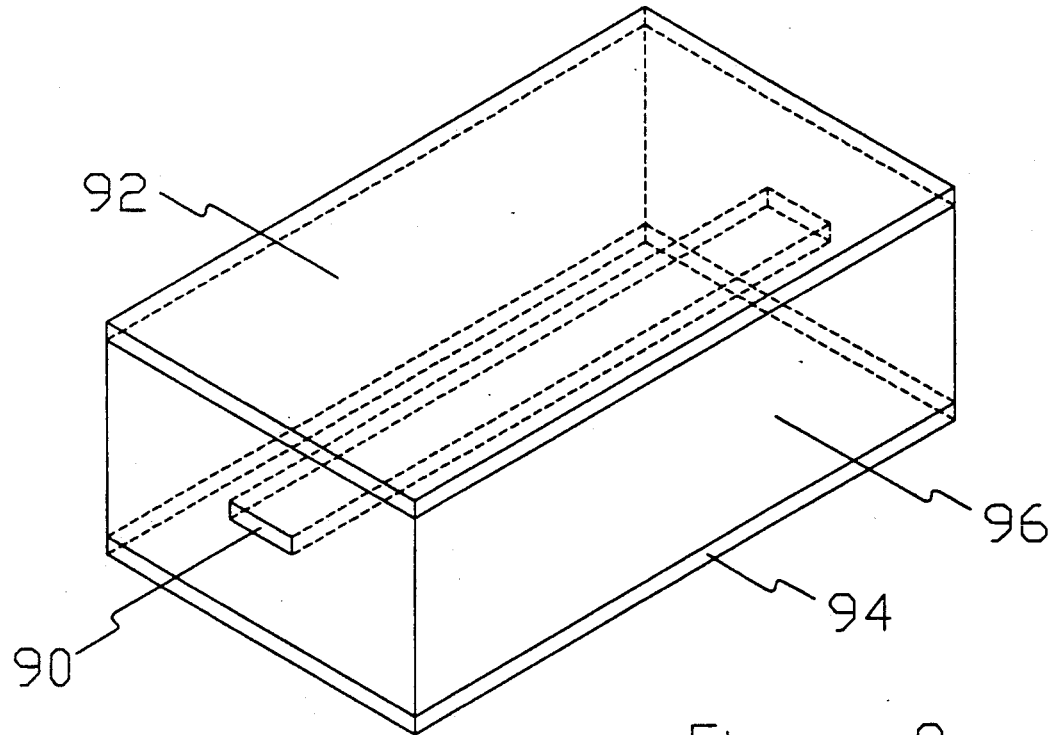
FIG. 8 is an isometric drawing of a stripline transmission-line structure.

Similarly, with reference to FIG. 8 of the included drawings, a nonlinear transmission line according to the present invention could be configured in a stripline transmission-line configuration. Whereas a stripline structure comprises a center conductor 90 with conductive planes 92 and 94 one above and one below the center conductor 90, and configured with a semiconductor substrate 96, a nonlinear transmission-line structure according to the present invention may be provided between the center conductor 90 and each conductive plane 92 and 94, or between the center conductor 90 and only one conductive plane 92 or 94. The spacing of conductive plane 92 from center conductor 90 may be either equal to or different from the spacing of conductive plane 94 from center conductor 90. Conductive planes 92 and 94 may be either electrically connected or electrically isolated. Further, the materials above and below the center conductor 90 may be either of the same material or of different materials as previously described hereinabove.

Since the nonlinear transmission line according to the present invention exhibits well defined impedance characteristics at any line voltage even though such impedance is voltage dependent, several nonlinear transmission lines according to the present invention may be connected together in series to provide performance needed in applications that will become apparent by practice or the invention. An example of such an application of multiple nonlinear transmission lines according tot he present invention would be the placing of several such nonlinear transmission lines at various positions along a conventional long transmission line, a coaxial cable for example, where the characteristics of the nonlinear transmission lines would correct for the signal degrading properties of the long conventional transmission line.

Variations in the transmission-line structure according to the present invention may be made to provide performance needed in applications that will become apparent by practice of the invention For example, with reference to FIG. 1, the electrodes 14 and 16 comprising the transmission line conductors may be extended beyond the semiconductor diode region to form a simple linear transmission-line section. Such an extended-line configuration could be used to apply and extract signals in a nonlinear transmission line according to the present invention. Similarly, electrodes 14 and 16 may be configured at the electrode ends to form suitable attachment means, for example bonding pads or beam-lead constructions, to provide means of attachment of signal electrodes which preserve the high-performance provided by the nonlinear transmission line according to the present invention.

Figure 9:
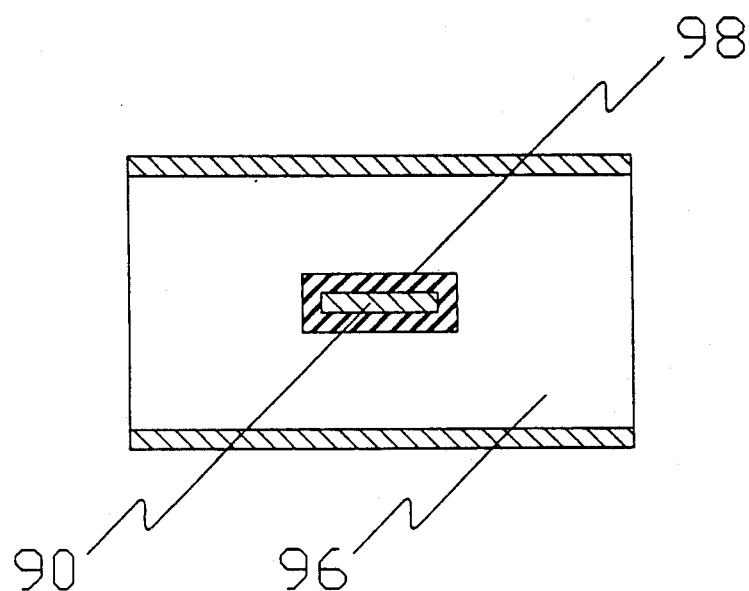
FIG. 9 shows a cross section of a stripline embodiment of the present invention comprising an insulating means separating the center conductor from the semiconductor substrate.

Further, in an embodiment of the present invention comprising an insulating means an MOS structure for example, one electrode may be provided with such insulating means, or more than one electrode many be provided with such insulating means. For example, with reference to FIG. 9 of the included drawings, a cross section of a stripline embodiment of the present invention is shown comprising an insulating means 98 included between center conductor 90 and semiconductor substrate 96.

Figure 10:
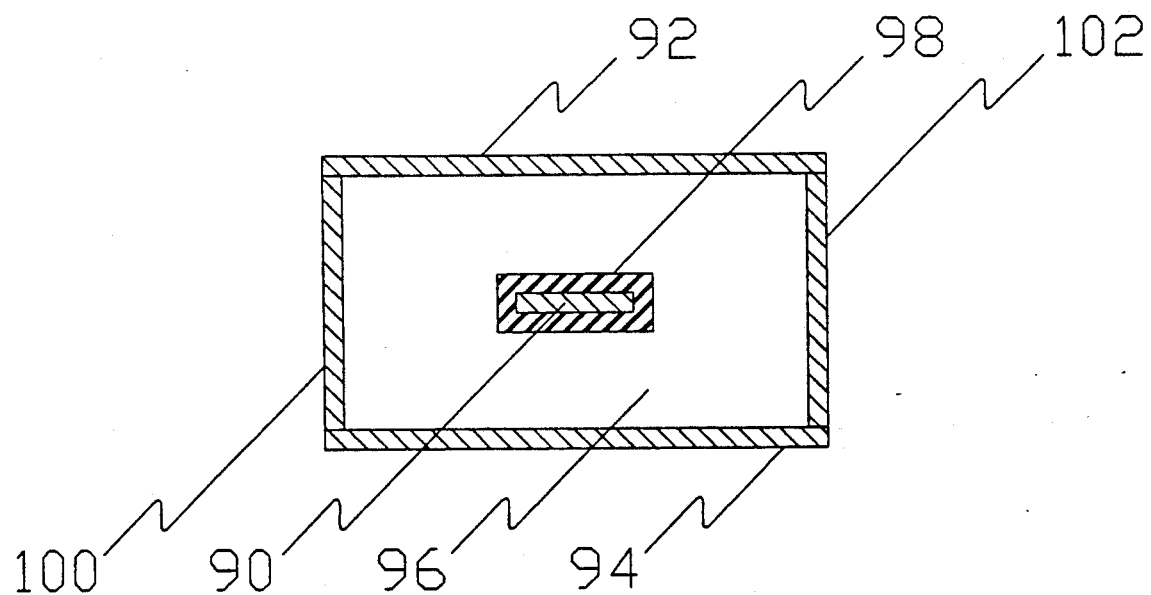
FIG. 10 shows a cross section of a coaxial transmission-line embodiment of the present invention.

Additionally, in embodiments of the present invention comprising conductive planes, for example a stripline embodiment as shown in FIG. 8, additional conductive planes may be included to form a totally conductive surround around one or more enclosed conductors to form a generally coaxial transmission-line configuration of rectangular or other desired cross section. A cross section of such a coaxial embodiment configured as a rectangular coaxial transmission line is shown in FIG. 10 of the included drawings wherein center conductor 90 is surrounded by insulating means 98 and semiconductor substrate 96, and a conductive surround comprising conductive planes 92, 94, 100 and 102 totally surrounds semiconductor substrate 96. The application of the insulating means 98 in FIG. 10 is illustrative, but any manner of signal-dependent variable capacitance, such as a semiconductor-diode structure for example as described hereinabove, may be applied with a coaxial embodiment of the present invention.

An embodiment of the present invention comprising a tubular outer conductor and a circular inner conductor would comprise a generally conventional circular coaxial transmission-line structure but further providing nonlinear characteristics as described hereinabove.

Still another useful variation in the present invention would be the application of a combination of both nonlinear and linear dielectric means comprising the dielectric means of a nonlinear transmission line according to the present invention. Such construction would provide a vary accurate control of the capacitance per unit length provided in a nonlinear transmission line thereby providing a very accurate control of the line impedance at various applied voltages. For example, the use of such a component of linear dielectric means would provide very accurate control of the line impedance at maximum applied voltage. Such accurate control of impedance would provide the means for accurate matching to the impedance of the nonlinear transmission line to the input signal means and output load means.

It will be apparent to those skilled in the art that modifications and variations may be made to the nonlinear transmission line according to the present invention. The invention in its broader aspects is therefore not limited to the specific details, representative methods and apparatus and illustrative examples shown and described hereinabove. Thus, it is intended that all manner contained in the foregoing description or shown in the accompanying drawings shall be interpreted as illustrative and not in a limiting sense, and the invention is intended to encompass all such modifications and variations as fall within the scope of the appended claims.

We claim:

1. A transmission line comprising:
   a. means for providing signal-dependent variable capacitance wherein said variable capacitance means is a semiconductor-diode;
   b. at least two means for carrying electrical current;
   c. at least one means for introduction of input signals; and
   d. at least one means for extraction of output signals wherein said semiconductor-diode further comprises a long, narrow junction geometry, and said at least two current-carrying means comprise the anode and cathode electrodes of said semiconductor-diode such that a transmission-line structure is formed comprising said current-carrying means and said semiconductor-diode, and said input means is connected between said least two current-carrying means, said output means is connected between said at least two current-carrying means, and the capacitance of said semiconductor-diode at any point along said long, narrow junction geometry of said semiconductor-diode is strongly a function of the signal magnitude applied to said semiconductor-diode at the same point along said long, narrow junction geometry such that the capacitance at any point along said transmission-line structure is strongly a function of the signal magnitude in said transmission-line structure at that same point along said transmission-line structure whereby highly nonlinear performance is provided in said transmission-line structure.

2. A transmission line as recited in claim 1 further comprising at least one of said current-carrying means having different dimensions at different positions along the length of said transmission line structure.

3. A transmission line as recited in claim 1 wherein the depletion region of said semiconductor diode is of different geometries at different positions along the length of said long, narrow junction geometry.

4. A transmission line as recited in claim 1 further comprising at least one of said current-carrying means having a width that is substantially narrower than the width of the other of said current-carrying means.

5. A transmission line as recited in claim 2 further comprising at least one of said current-carrying means having a width that is substantially narrower than the width of the other of said current-carrying means.

6. A transmission line as recited in claim 3 further comprising at least one of said current-carrying means having a width that is substantially narrower than the width of the other of said current-carrying means.

7. A transmission line as recited in claim 4 further comprising at least three current-carrying means wherein said narrower current-carrying means is positioned such that said narrower current-carrying means is situated between two of said current-carrying means.

8. A transmission line as recited in claim 5 further comprising at least three current-carrying means wherein said narrower current-carrying means is positioned such that said narrower current-carrying means is situated between two of said current-carrying means.

9. A transmission line as recited in claim 6 further comprising at least three current-carrying means wherein said narrower current-carrying means is positioned such that said narrower current-carrying means is situated between two of said current-carrying means.

10. A transmission line as recited in claim 1 wherein said transmission line structure is a coaxial transmission-line structure.

11. A transmission line comprising:
   a. means for providing signal-dependent variable capacitance wherein said variable capacitance means comprises a semiconductor substrate;
   b. at least one means for providing electrical insulation;
   c. at least two means for carrying electrical current;
   d. at least one means for introduction of input signals; and
   e. at least one means for extraction of output signals wherein said current-carrying means and said semiconductor substrate comprise a transmission-line structure wherein said current-carrying means form the electrodes of said transmission-line structure and said semiconductor-substrate is interposed between said at least two current-carrying means, and said insulating means is provided on at least one of said current-carrying means such that said current-carrying means having said insulating means provided is separated from said semiconductor-substrate by said insulating means, and said input means is connected between said at least two current-carrying means, and said output means is connected between said at least two current-carrying means, and said semiconductor-substrate and said insulating means comprise a capacitance along said transmission-line structure wherein said capacitance at any point along the length of said transmission-line structure is strongly a function of the signal magnitude applied in said transmission-line structure at that same point along said transmission-line structure such that the capacitance at any point along said transmission-line structure is strongly a function of the signal magnitude in said transmission-line structure at that same point along said transmission-line structure whereby highly nonlinear performance is provided in said transmission-line structure.

12. A transmission line as recited in claim 11 further comprising at least one of said current-carrying means having different dimensions at different positions along the length of said transmission line structure.

13. A transmission line as recited in claim 11 wherein said spacing between said current-carrying means is different at different positions along said transmission line structure.

14. A transmission line as recited in claim 11 further comprising at least one of said current-carrying means having a width that is substantially narrower than the width of the other of said current-carrying means.

15. A transmission line as recited in claim 12 further comprising at least one of said current-carrying means having a width that is substantially narrower than the width of the other of said current-carrying means.

16. A transmission line as recited in claim 13 further comprising at least one of said current-carrying means having a width that is substantially narrower than the width of the other of said current-carrying means.

17. A transmission line as recited in claim 14 further comprising at least three current-carrying means wherein said narrower current-carrying means is positioned such that said narrower current-carrying means is situated between two of said current-carrying means.

18. A transmission line as recited in claim 15 further comprising at least three current-carrying means wherein said narrower current-carrying means is positioned such that said narrower current-carrying means is situated between two of said current-carrying means.

19. A transmission line as recited in claim 16 further comprising at least three current-carrying means wherein said narrower current-carrying means is positioned such that said narrower current-carrying means is situated between two of said current-carrying means.

20. A transmission line as recited in claim 11 wherein said transmission line structure is a coaxial transmission-line structure.

* * * * *